United States Patent [19]

Hidaka et al.

[11] Patent Number: 5,172,083
[45] Date of Patent: Dec. 15, 1992

[54] MICROWAVE PLASMA PROCESSING APPARATUS

[75] Inventors: Ryota Hidaka, Kitakyushu; Yoshinobu Kawai, Fukuoka; Ryuji Koga; Toru Yamaguchi, both of Kitakyushu, all of Japan

[73] Assignee: Nippon Steel Corporation, Tokyo, Japan

[21] Appl. No.: 882,598

[22] Filed: May 13, 1992

[30] Foreign Application Priority Data

May 14, 1991 [JP] Japan .................................. 3-109383
Mar. 3, 1992 [JP] Japan .................................. 4-45391

[51] Int. Cl.$^5$ .............................................. H05H 1/30
[52] U.S. Cl. ........................... 333/99 PL; 315/111.41; 315/39; 313/231.31
[58] Field of Search .............. 333/99 PL; 315/111.41, 315/111.21, 39; 313/231.31

[56] References Cited

U.S. PATENT DOCUMENTS 4,970,435 11/1990 Tanaka et al. .................. 315/111.21

FOREIGN PATENT DOCUMENTS 1-122123 5/1989 Japan .

Primary Examiner—Eugene R. LaRoche
Assistant Examiner—Ali Neyzari
Attorney, Agent, or Firm—Cushman, Darby & Cushman

[57] ABSTRACT

A microwave plasma processing apparatus includes a microwave waveguide connected to a microwave power source, a mode converting wave guide and a plasma chamber. The apparatus comprises a lower induction waveguide forming part of the microwave waveguide and connected to the mode converting waveguide including, a rectangular form inlet portion, and a cylindrical portion having one of shorter side walls (E planes) placed at a control portion including a point corresponding a center point of a connecting portion connected to the plasma chamber, and the other of the shorter side walls formed into an arc shaped configuration corresponding to a circle of the connecting portion connected to the plasma chamber, the arc shaped shorter side wall is gradually expanded about the center point to establish a fan shape and form a window portion of the mode converting waveguide, and the mode converting wave guide extending between the window portion thereof to the connecting portion connected to the plasma chamber, is formed by gradually extending the arc forming the window portion toward the connecting portion and joining opposing longer side walls (H planes) to each other to establish the connecting portion connected to the plasma chamber at the end thereof where the both longer side walls meet.

17 Claims, 20 Drawing Sheets

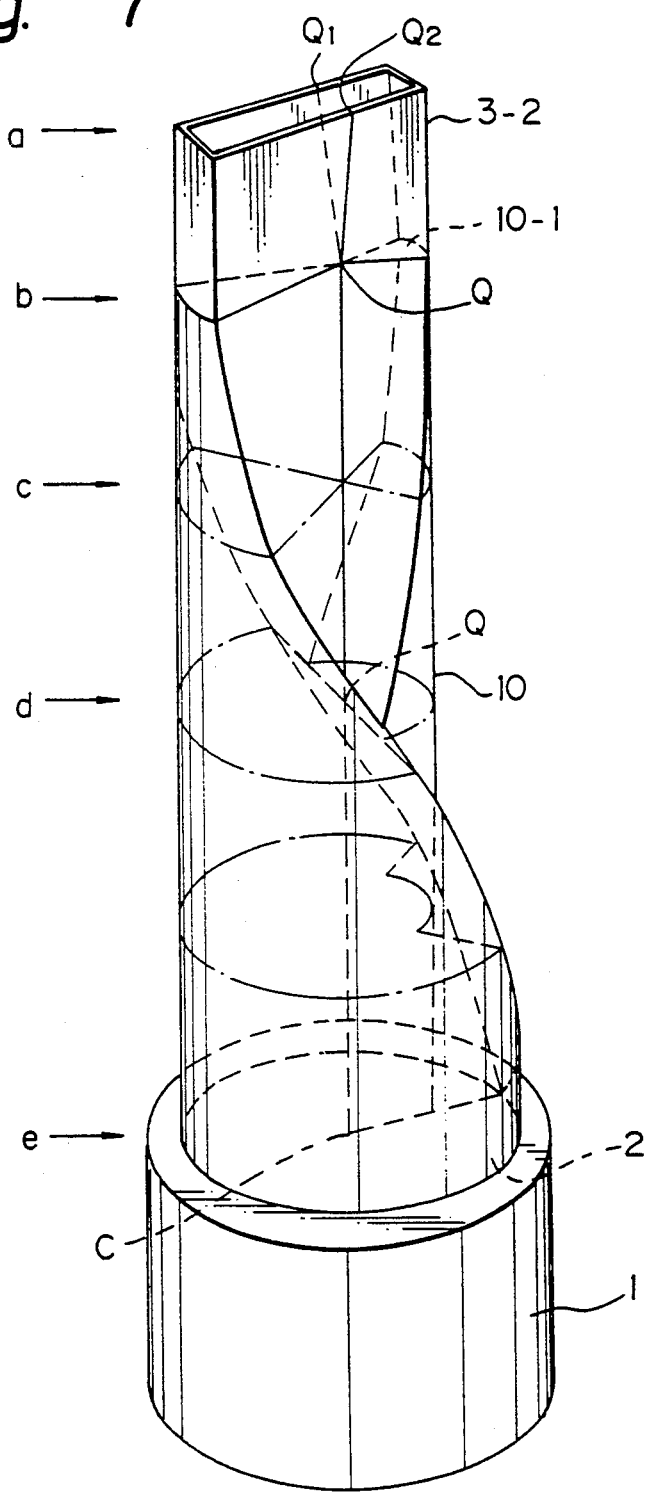

Fig. 17
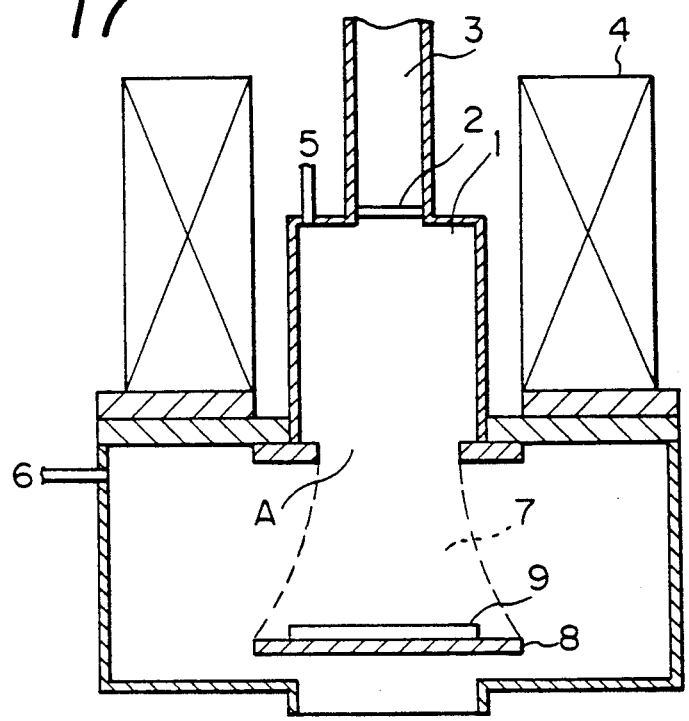
Fig. 18(a)   $\lambda c = 2a$
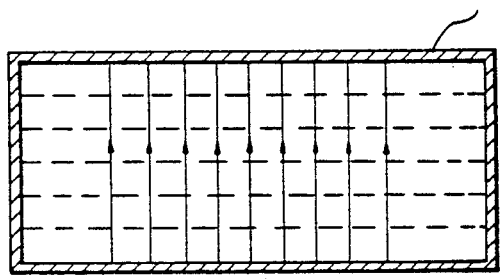
Fig. 18(b)
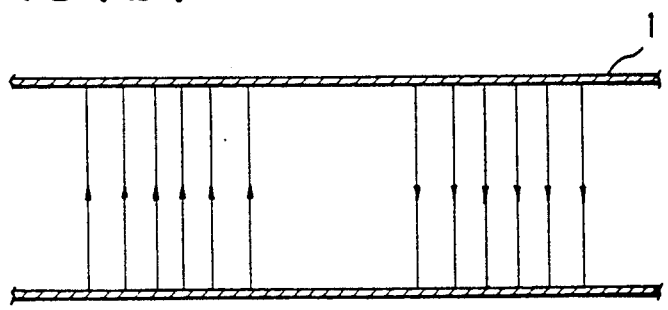

$\lambda c = 3.412a$ $\lambda c = 1.640a$ $\lambda_c = 2.613a$

1

MICROWAVE PLASMA PROCESSING APPARATUS

BACKGROUND OF THE INVENTION

1. Field of the Invention

The present invention relates to a processing apparatus employing a microwave plasma, as a plasma processing apparatus fabricating semiconductor elements and so forth employing a low temperature plasma. More particularly, the invention relates to a microwave plasma processing apparatus suitable for large area processing in the CVD, etching, sputtering methods and so forth.

2. Description of the Related Art

A plasma processing technology employing a microwave is important due to its capability of reducing contamination of electrode materials, because typically it employs an electrodeless discharge. Also, a microwave discharge using an electron-cyclotron-resonance (ECR) has attracted attention due to its excellent characteristics, such as (1) uniformity of directionality of motion of ions generated for a capability of discharge at a low pressure ($10^{-5}$ Torr), (2) capability of generating a high density plasma, and (3) long life and capability of use of an active gas for an electrodeless discharge.

FIG. 17 shows a plasma chamber employing the conventional ECR discharge, and a basic construction of an ECR-CVD apparatus employing the plasma chamber. A microwave source, not illustrated, is formed by employing a magnetron of 2.45 GHz. Typically, a rectangular wave guide having a size of 96 mm×27 mm or 109 mm×54 mm is employed as a microwave guide 3. Also, the plasma chamber 1 has an internal diameter of approximately 200 mm. In many cases, the plasma chambers 1 employ a cavity resonance structure for microwaves for an effective charge of microwave power. The microwave power introduced into the plasma generation chamber 1 through the wave guide 3 is consumed for a generation of plasma.

The generated plasma is withdrawn toward a sample 9 through a plasma withdrawing window A. The plasma withdrawing window A is provided for maintaining the cavity resonance structure of the plasma generation chamber 1 and for withdrawing the uniform portion of the generated plasma. Namely, since an electric field strength of the microwave is weakened at the peripheral portion of the plasma generation chamber 1, to thus cause a difference in the plasma densities at the center portion and at peripheral portions, the plasma withdrawing window is designed to withdraw only a uniform portion of the generated plasma. A magnetic coil 4 is provided for establishing a direct current magnetic field satisfying an ECR condition (875 Gauss), and the generated plasma is effectively dispersed toward the sample 9 in a weak magnetic field region. As set forth above, by radiating the plasma onto the sample, a process, such as CVD, etching or so forth can be performed for a substrate.

In the conventional microwave plasma processing apparatus having a construction by which the microwave power generated by a magnetron is introduced, as set forth above, into the plasma chamber 1 through the wave guide 3, a propagation mode of the microwave in the rectangular waveguide is typically TE10 mode. Where the plasma chamber has a rectangular configuration, the mode of the microwave is a rectangular TE10 mode as illustrated in FIG. 18. Conversely, when the plasma generation chamber has a cylindrical configuration, the mode of the microwave becomes the TE11 mode as illustrated in FIG. 19. It should be noted that, in FIGS. 18 and 19, (a) are sections respectively taken on a plane perpendicular to the propagation direction of the microwave, and (b) are sections taken on a plane parallel to the propagation direction of the microwave. It is to be further noted that the solid lines represent electric line of force and broken lines represent magnetic force lines.

As a technology enabling a generation of a greater area of plasma, there is known a technology for controlling a mode of the microwave, as disclosed in Japanese Unexamined Patent Publication (Kokai) No. 1-122123. As shown in FIG. 20, this technology employs a mode-converting wave guide having a quadrilateral configuration incorporating a pair of mutually opposed arc-shaped segments arranged in a circle centered at an axis of the plasma chamber, for controlling the mode of the microwave. With the disclosed prior art, it is possible to form the TM11 mode and TM10 mode as shown in FIGS. 21 and 22.

Nevertheless, the plasma generation technology employing the microwaves in the TM01 mode and TM11 mode disclosed in Japanese Unexamined Patent Publication No. 1-122123 encounters the following problems. With respect to the TE11 mode, TM11 mode and TM10 mode, a radius a of a circular wave guide has the following relationship, taking the cut-off wavelength of a propagating microwave as $\lambda c$:

$\lambda c = 3.412a$ (TE11 mode)

$\lambda c = 1.640a$ (TM11 mode)

$\lambda c = 2.613a$ (TM01 mode)

As can be appreciated from these equations, in the TM11 mode, the radius a of the cylindrical wave guide can be 2.08 times that in the TE11 mode, but in TM11 mode, as shown in FIG. 21, an electromagnetic field mode of the microwave is not uniform, and thus difficulties arise in the generation of a uniform plasma. On the other hand, as shown in FIG. 22, although a uniform electromagnetic field of the microwave can be established in the TM01 mode, an expansion of the area to be obtained is merely 1.31 times that of the conventional TE11 mode.

SUMMARY OF THE INVENTION

Therefore, an object of the present invention is to provide a plasma processing apparatus which can introduce a uniform microwave power into a plasma chamber with a high efficiency and with a sufficiently expanded area.

To accomplish the above object, according to the present invention, there is provided a microwave plasma processing apparatus including a microwave waveguide connected to a microwave power source, a mode converting wave guide and a plasma chamber, comprising a lower induction waveguide forming part of the microwave guide and connected to the mode converting waveguide, including a rectangular form inlet portion; and a cylindrical portion having one of shorter side walls (E planes) placed at a control portion including a point corresponding to a center point of a connecting portion connected to the plasma chamber, and the other of the shorter side walls formed into an arc-shaped configuration corresponding to a circle of the connecting portion connected to the plasma chamber, the arc-shaped shorter side wall being gradually expanded about the center point to thereby establish a fan shape and form a window portion of the mode converting waveguide, and the mode converting waveguide extending between the window portion thereof to the connecting portion connected to the plasma chamber, and being formed by gradually extending the arc forming the window portion toward the connecting portion and bringing opposing longer side walls (H planes) to each other to establish the connecting portion connected to the plasma chamber at the end thereof where both longer side walls meet.

With the shown construction, the microwave power can be effectively and uniformly propagated to enable a generation of a uniform plasma over a large area. Namely, a TE10 mode as principal mode of propagation in the rectangular waveguide is gradually deformed into a fan shape, and by expanding the center angle of the fan shape, the surfaces (E planes) parallel to the electric line of force line are formed into a circular configuration, taking the surfaces (H planes) parallel to the magnetic line of force as a radius, whereby the circular TE01 mode can be obtained.

The dimension of the cylindrical waveguide in the TE01 mode can propagate microwaves with a 2.08 times greater diameter than that of the rectangular waveguide for the TE10 mode propagation, while providing an equivalent cut-off wavelength of the microwave. Note, the dimension of the cylindrical waveguide able to propagate in the TE0n mode can be greater than the dimension of the cylindrical wave guide propagating in the TE01 mode, and accordingly, it becomes possible to enlarge the diameter of the waveguide connected to the plasma generation chamber. Furthermore, by employing the TE01 mode and other TE0n modes, a generation of a large area plasma can be realized.

BRIEF DESCRIPTION OF THE DRAWINGS

The present invention will be more fully understood from the detailed description given herebelow and from the accompanying drawings of the preferred embodiments of the invention, which are not limitative but only for an explanation and understanding of the invention.

In the drawings:

FIG. 7 is a perspective view of a still further embodiment of the present invention for converting the TE30 rectangular induction waveguide into the TE02 circular waveguide;

FIG. 17 is an illustration showing one example of the conventional plasma processing apparatus;

FIG. 18(a) and 18(b) illustrations showing an electromagnetic field distribution of the rectangular waveguide of TE10;

DESCRIPTION OF THE PREFERRED EMBODIMENTS

Figure 1:
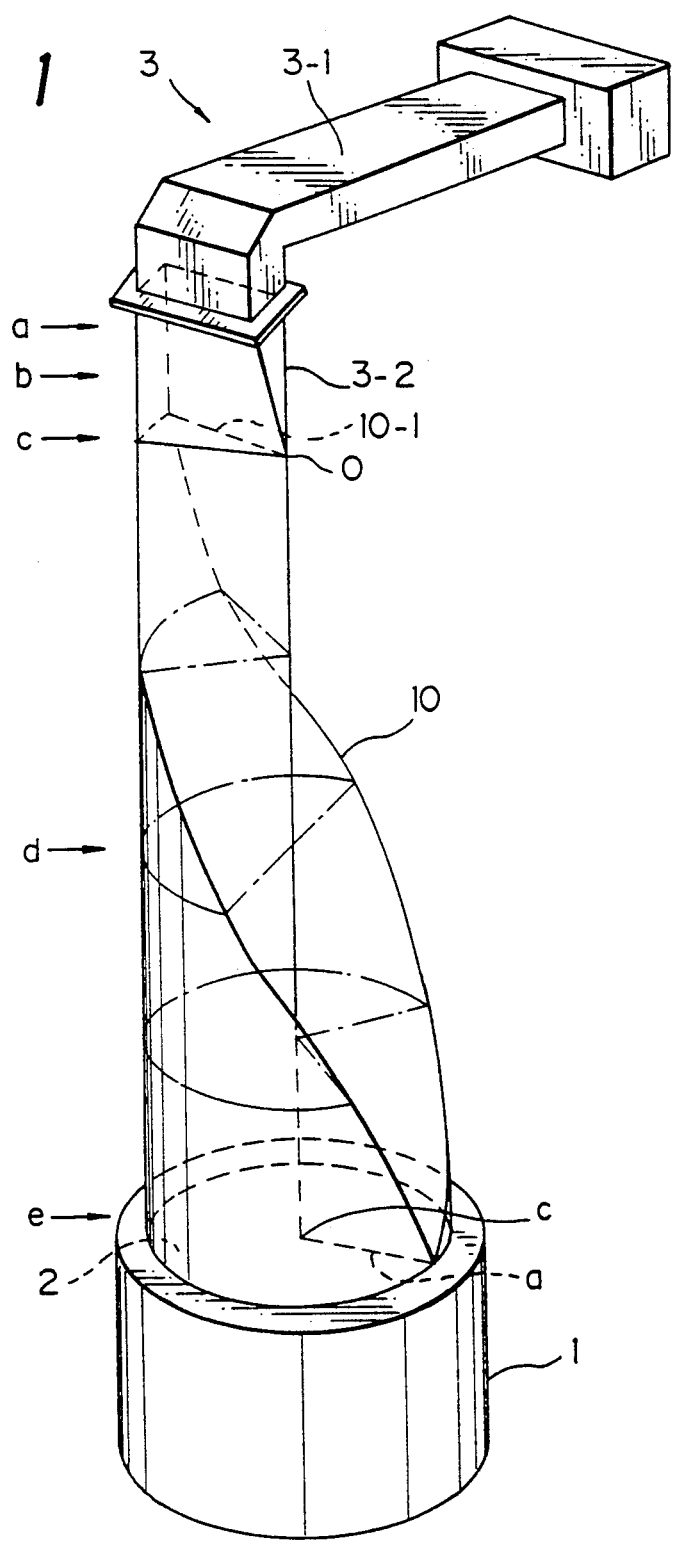
FIG. 1 is a perspective view of the preferred embodiment of the present invention for converting a TE10 rectangular induction waveguide into a TE01 circular waveguide.
Figure 2A:
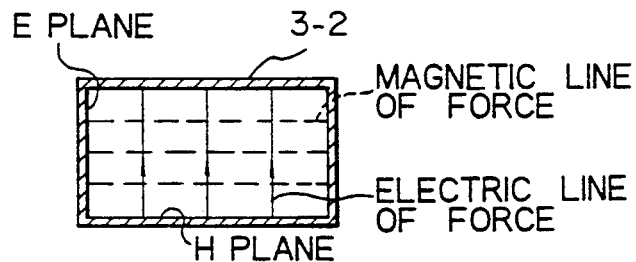
FIGS. 2(a) to 2(e) are sections of respective portions a to e of FIG. 1.
Figure 2B:
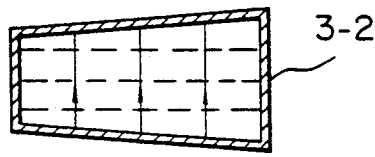
Figure 2C:
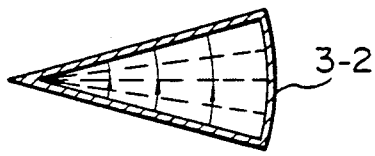
Figure 2D:
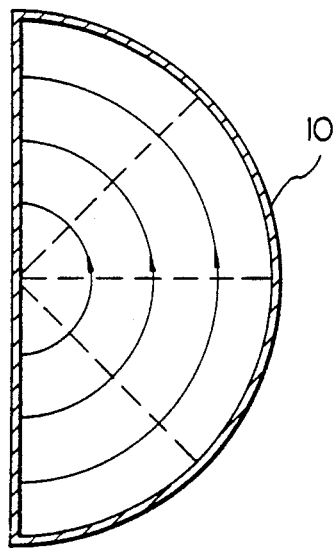
Figure 2E:
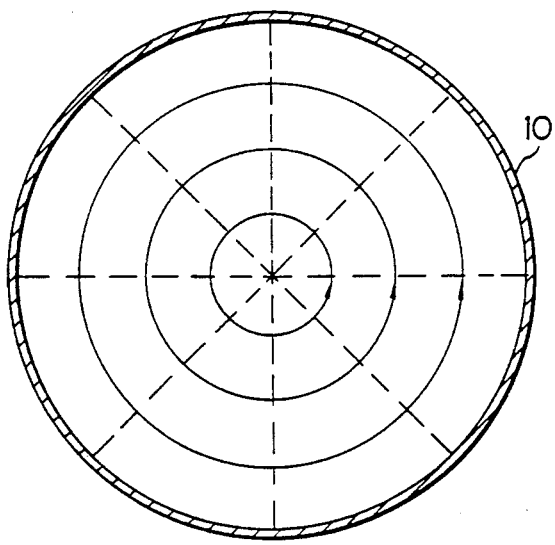

FIG. 1 shows one embodiment of the present invention. As set forth above, in a principal rectangular waveguide, a 96 mm×27 mm or 109 mm×54 mm waveguide is used. When such a waveguide is directly connected to a plasma chamber with a cylindrical configuration, because of propagate a microwave in the TE10 mode, the TE11 mode is generated in the plasma chamber. Accordingly, to generate a microwave mode having an electric line of force parallel to a side wall of the plasma chamber having cylindrical configuration, to thereby introduce microwave power into a plasma chamber with an expanded diameter, the rectangular waveguide 3, according to the present invention, is connected to a mode converting waveguide 10 having one of the shorter side walls thereof formed into an arc-shaped configuration and the other shorter side wall directed toward a center point C of the circle.

Namely, the rectangular waveguide 3 has an upper waveguide 3-1 connected to a magnetron generating a microwave and a lower induction waveguide 3-2 connected to the mode converting waveguide 10. The lower induction waveguide 3-2 is constructed so that one of the shorter side walls has an arc-shaped configuration coinciding with a circle of a connecting portion 2 adjoining the plasma chamber 1, and the other shorter side wall is gradually narrowed downward and converged at a center 0 corresponding to a center C of the connecting portion 2 connected to the plasma chamber 1. The shown configuration of the lower induction waveguide 3-2 forms a window portion 10-1 of the mode converting waveguide 10. The mode converting waveguide 10 is extended from this window portion 10-1 to the connecting portion 2 connecting with the plasma chamber, and an arc length is gradually increased, taking the center line as O-C, in the longitudinal direction so that a complete circle is established at the connecting portion 2 as the terminating end of the waveguide.

The length of the mode converting waveguide 10 may be equivalent or more to a wavelength (122 mm with respect to 2.45 GHz) of the microwave to be propagated. With the arrangement set forth above, the electric line of force of the microwave may be parallel to the arc.

FIGS. 2(a) to 2(e) show sections of various portions a to e of FIG. 1 for illustrating variations of the cross-sectional configuration of the lower induction waveguide 3-2 and the mode converting waveguide 10. Also, In FIGS. 2(a) to 2(e), the electric line of force is illustrated with solid lines headed by an arrow, which are directed concentrically to the mode converting waveguide 10. It should be noted that, in these figures, broken lines represent magnetic line of force.

Figure 3:
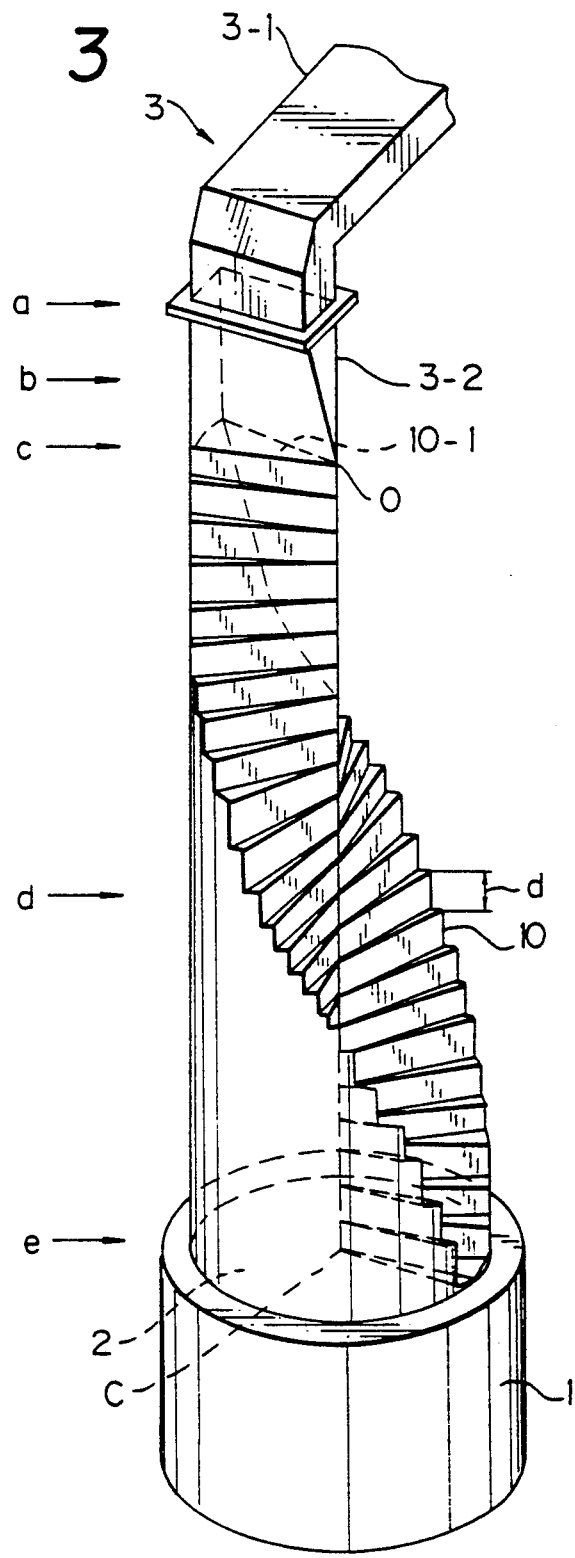
FIG. 3 is a perspective view of another embodiment of the present invention for converting the TE10 rectangular induction waveguide into the TE01 circular waveguide.

Variations of the configuration of the mode converting waveguide 10 in the longitudinal direction can be continuous as illustrated in FIG. 1, and in the alternative, can be made stepwise by varying the sections step by step. The stepwise variation of the cross-sectional configuration of the mode converting waveguide 10 may facilitate the production thereof. In this case, a reflection of the microwave may occur at the steps and lower the microwave propagation efficiency. Such a reflection of the microwave can be suppressed, to obtain a sufficiently high microwave propagation efficiency by providing mutually opposite phases for the respective reflected microwaves. Namely, when a the following relationship between an interval d at the steps (see FIG. 3) and a guide wavelength $\lambda g$ of the microwave is established $$d = \frac{\frac{2P+1}{2}}{2} x\lambda g = \frac{2P+1}{4} x\lambda g.$$

$(P = 0, 1, 2, \ldots)$ the phases of the reflected microwaves can suppress an influence of a reflection of the microwave.

It should be noted that, for the embodiments of FIGS. 4, 7, 10, 13 and 15, in addition to the embodiment of FIG. 1, the stepwise and discontinuous variation of the configuration of the mode converting waveguide can be employed for converting the rectangular TEn0 mode into the circular TE0n mode.

According to the present invention, by positively utilizing the TE0n mode microwave, the radius a (see FIG. 1) of the waveguide can be expended to make it possible to uniformly introduce the microwave power into a large area plasma chamber, as expressed by the following equation:

$$a = \frac{\lambda c}{2\pi} \times \frac{1}{X'_{0n}}$$

where $X'^{On}$ represents a radix of $J'_0(X)=0$, and $J'_0(X)$ is a zero-dimensional Bessel's differential function.

Figure 4:
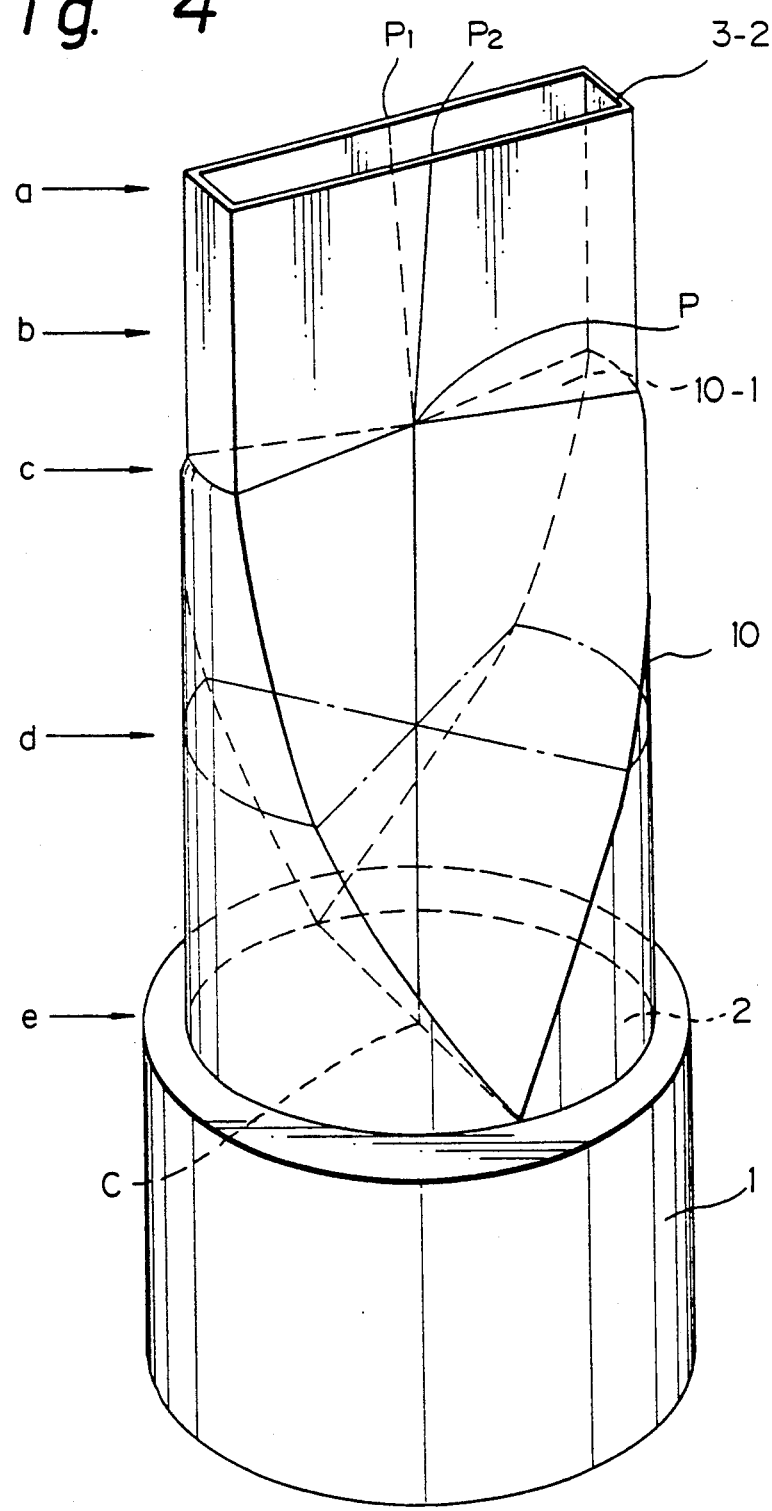
FIG. 4 is a perspective view of a further embodiment of the present invention for converting the TE20 rectangular induction waveguide into the TE01 circular waveguide.

FIG. 4 shows an example wherein the conversion of the waveguide mode shown in FIG. 2 is performed by employing the TE20 mode.

Figure 5A:
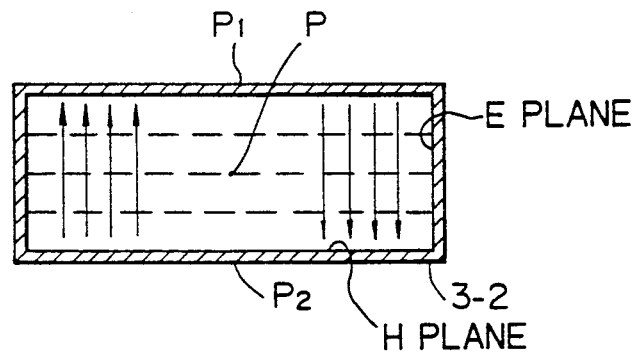
FIGS. 5(a) to 5(e) are sections of respective portions a to e of FIG. 4.
Figure 5B:
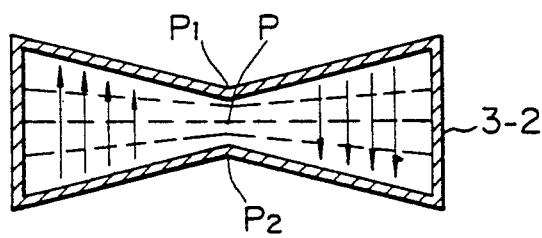
Figure 5C:
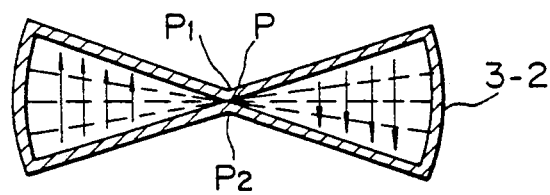
Figure 5D:
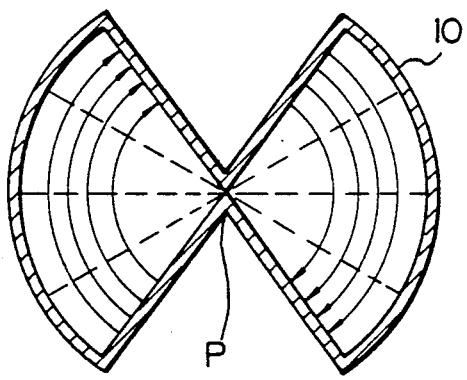
Figure 5E:
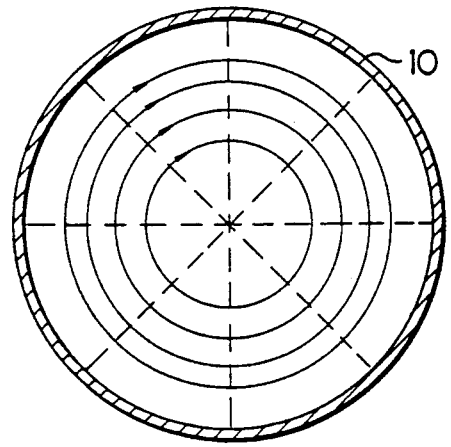
Figure 6A:
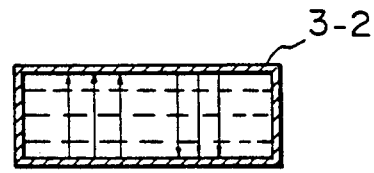
FIGS. 6(a) to 6(e) are sections of respective portions a to e of FIG. 1 when a TE20 rectangular mode is converted into a TE02 circular mode with the embodiment of FIG. 1.
Figure 6B:
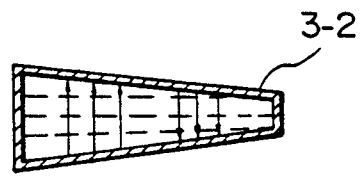
Figure 6C:
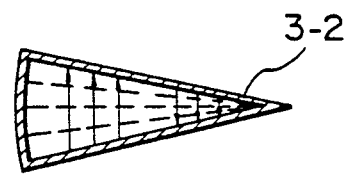
Figure 6D:
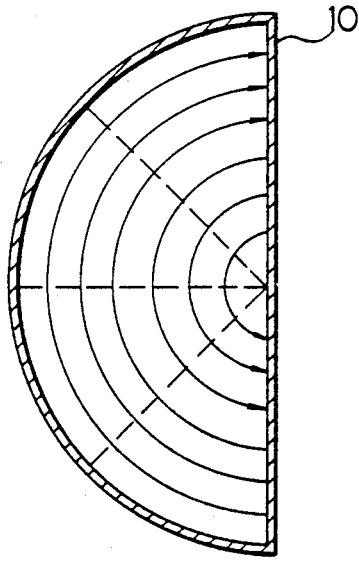
Figure 6E:
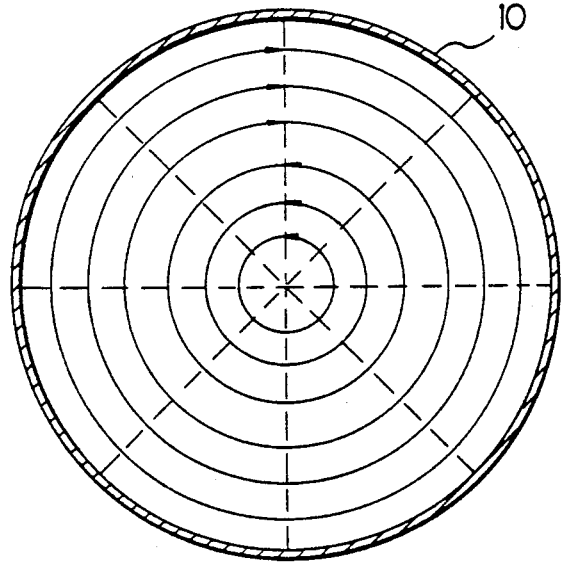

Namely, at a rectangular section of the lower induction waveguide 3-2 for the microwave, as represented by (a) in FIG. 4, the electric field as illustrated in FIG. 5(a) is present and no electric field is present at the central portion P. Accordingly, by gradually bringing the center points $P_1$ and $P_2$ of the longer side walls (H planes) of the induction waveguide 3-2 toward each other, to converge toward the center P of the arc, and by gradually deforming the opposing shorted edges (E plnes) into the arcs coincident with the arc of the window 10-1 of the mode converting waveguide 10. The length of the each arc forming the window 10-1 of the mode converting waveguide is gradually expanded downwardly about the center line P-C downwardly so that the complete circle can be established at the connecting portion 2 for adjoining with the plasma chamber 1, and thus the circular TE01 mode can be established.

FIGS. 5(a) to 5(e) show sections of various portions a to e of FIG. 4. FIG. 4(e) shows that the electric lines of force are established in concentric fashion with the mode converting waveguide 10, and thus are in parallel to the peripheral wall surface of the mode converting waveguide 10.

In the above-mentioned embodiments, rectangular induction waveguide of the TE2×n, 0 mode (n is a positive integer) can be equally converted into a circular TE0n mode. In such a case, since two fan shaped induction waveguides can be formed simultaneously, it becomes easier to establish an impedance matching of the microwave at a shorter length of the mode converting waveguide, in comparison with the case in which a mode conversion is performed by employing single fan shaped waveguide, and thus it is unnecessary to form a uniform microwave phase by branching or the waveguide or so forth.

FIG. 6 shows an example in which the mode conversion is performed by setting the mode of the lower microwave induction waveguide 3-2 of FIG. 1 to the TE20 mode. Similar to the conversion of the TE10 mode to the circular TE01 mode, the TE20 mode in the lower induction waveguide 3-2 can be converted into the TE02 circular mode, and similarly, TEn0 mode can be converted into circular TE0n mode.

FIG. 7 shows an example adapted to perform a mode conversion employing the TE30 mode.

Figure 8A:
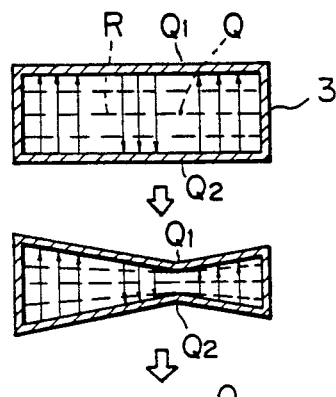
FIGS. 8(a) to 8(e) are sections of respective portions a to e of FIG. 7.
Figure 8B:
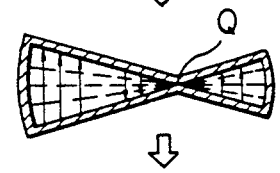
Figure 8C:
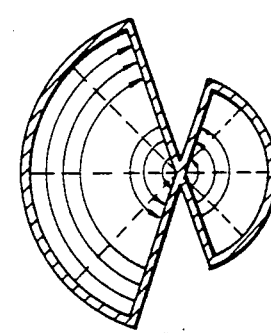

Namely, as shown in FIG. 7(a), in the rectangular lower induction waveguide 3-2 adapted to propagation of the TE30 mode, the electric field component as illustrated in FIG. 8(a) is present. As can be seen, there are two points Q and R in the central portion of the rectangular induction waveguide at which where no electric field is present.

Figure 8E:
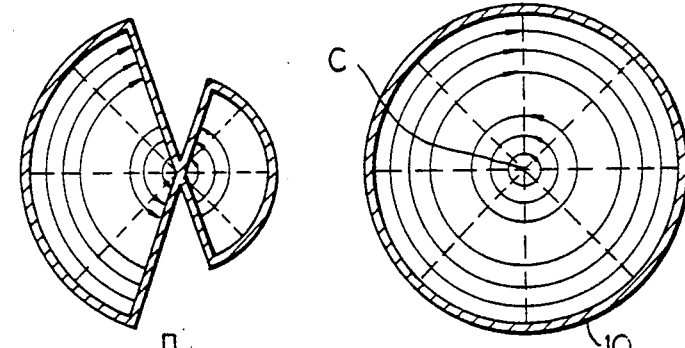
Figure 8D:
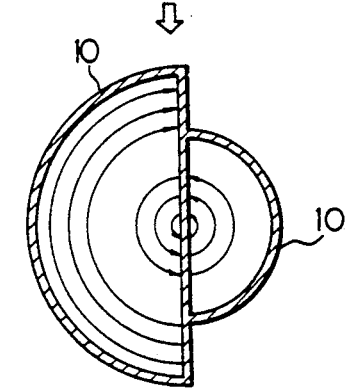

Accordingly, the lower induction waveguide 3-2 is deformed in such a manner that a center point of an arc is established at one of these two points, for example, at Q. Namely, the points $Q_1$ and $Q_2$ on the longer side walls (H planes) corresponding to the point Q are made to gradually approach each other and converge at the center Q of the arc, and the shorter side walls (E planes) are gradually deformed into the large and small arcs centered at the center point Q, to form the window 10-1 of the mode converting waveguide. In the mode converting waveguide 10, the length of the each arc is gradually expanded from the window 10-1 to the plasma chamber 1 about the center line Q-C in the longitudinal direction of the waveguide 10, to widen the fan shapes and to finally establish the complete circle at the connecting portion 2. Therefore, as shown in FIG. 8(e), a circular TE02 mode is established. The mutually opposing longer side walls gradually vary the angles about the center point Q and become integrated when the shorter side walls are expanded to define half circles. With the shown arrangement, in a similar manner, the TE2xm+1, 0 mode can be converted into the circular TE0, 2xm-K mode. Here, m is 0 or a positive integer, and K is a positive integer smaller than m.

FIG. 8(a) to 8(e) show sections at various portion a to e of FIG. 7. FIG. 8(e) shows the electric lines of force formed concentrically with the mode converting waveguide 10 and directed along the peripheral wall surface of the wave guide.

Figure 9:
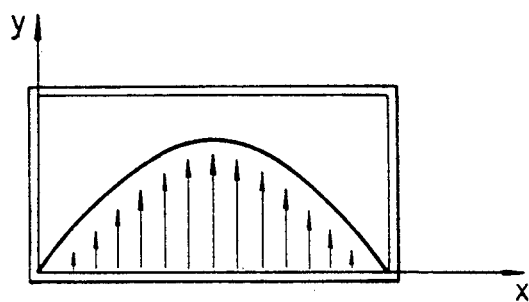
FIG. 9 is an illustration showing a distribution of an electric field intensity parallel to an E surface of TE10 mode in the rectangular induction waveguide.

As shown in FIG. 9, the electric field Ey of the microwave of the rectangular TE10 mode propagated in the rectangular waveguide, in the y direction parallel to the E plane, has a sine shaped distribution in the x direction parallel to the H plane which is a maximum at the center of the waveguide. In the mode converting waveguide of FIGS. 1 to 7, when the shorter side wall is deformed to establish a center of the arc, since the microwave power propagated by the induction waveguide is constant, the electric field intensity is increased when the longer side walls (H planes) are brought into contact by reducing the distance therebetween. This brings a possibility of a burn out of the induction waveguide due to a generation of an arc discharge at the portion having a high electric field intensity, when a high power microwave is introduced.

Through experiments it has been confirmed that, when the microwave power is higher than or equal to 3 kW, a burn out due to a discharge frequently occurs. Therefore, it is necessary to provide a plasma processing apparatus that can introduce the microwave power into the plasma chamber without causing a burn out of the induction waveguide, under any condition.

Figure 10:
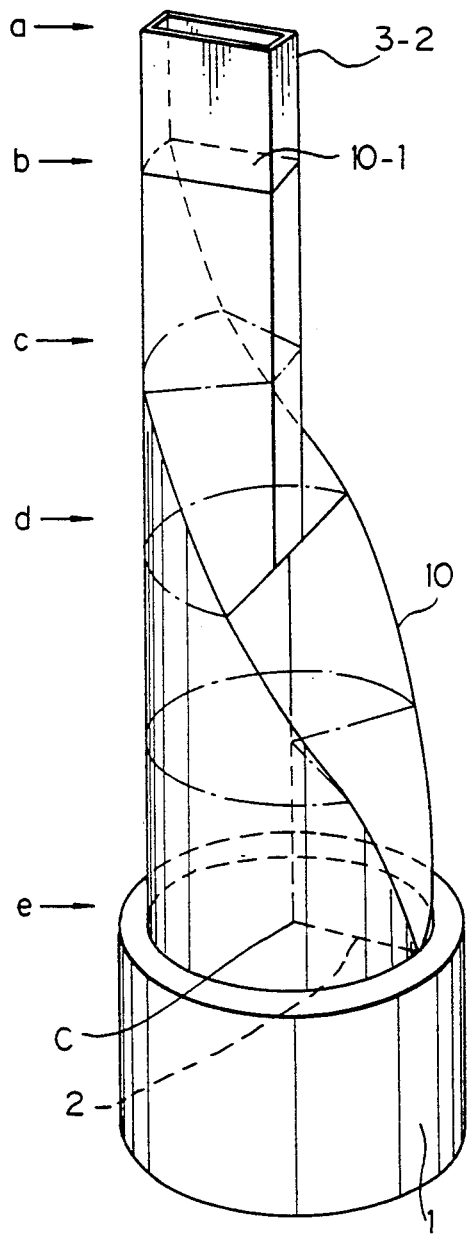
FIG. 10 is a perspective view of a yet further embodiment of the present invention for converting the TE10 rectangular induction waveguide into the TE01 circular waveguide.
Figure 11A:
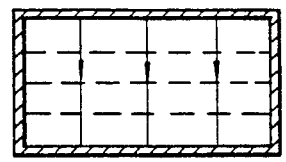
FIGS. 11(a) to 11(e) are sections of respective portions a to e of FIG. 10.
Figure 11B:
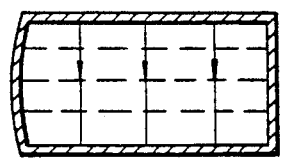
Figure 11C:
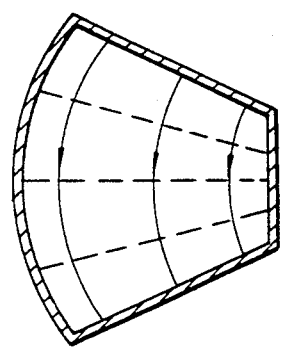
Figure 11D:
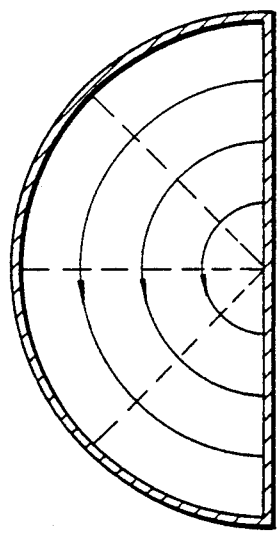
Figure 11E:
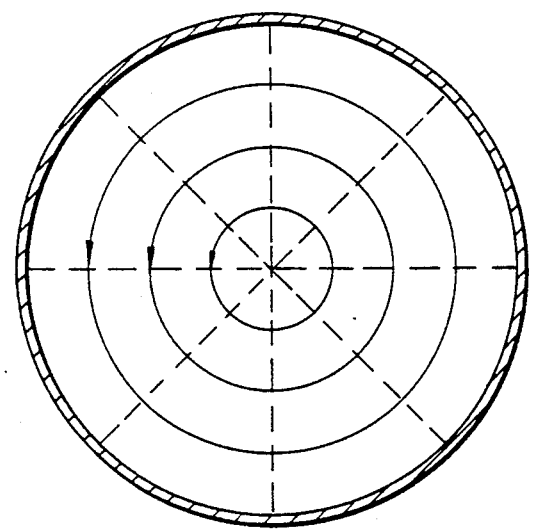
Figure 12A:
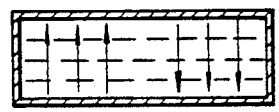
FIGS. 12(a) to 12(e) are sections of respective portions a to e of FIG. 10 when a TE20 rectangular mode is converted into a TE02 circular mode with the embodiment of FIG. 10.
Figure 12B:
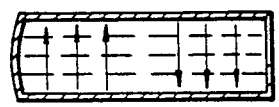
Figure 12C:
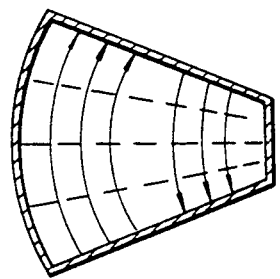
Figure 12D:
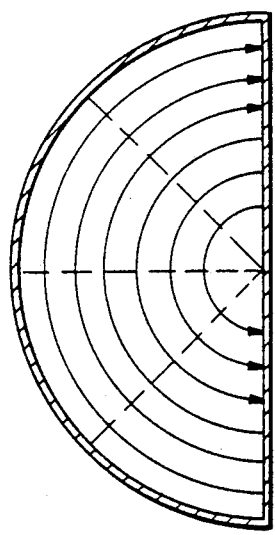
Figure 12E:
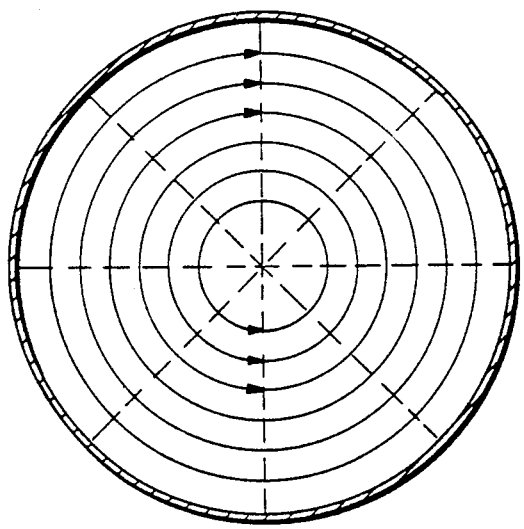

FIG. 10 shows an embodiment in which a conversion into TE01 mode can be achieved without joining the longer side walls of the lower induction waveguide 3-2 of FIG. 1. In this embodiment, only one of the shorter side walls parallel to the electric line of force is formed into an arc shaped configuration continuous to the window 10-1 of the mode converting waveguide 10 (see portion a of FIG. 10 and FIG. 11(a)).

While maintaining one of the shorter side wall $E_1$ extended in parallel to the electric line of force among the shorter side walls forming the window 10-1 of the mode converting waveguide, without variation, the arc length of the arc shaped shorter side wall Ez is increased (portions b to c of FIG. 10), the complete circle is formed at the end via the half circle (portions d to e of FIG. 10), which end forms the connection portion to be joined with the plasma chamber 1. The shorter side wall $E_1$ lines diametrically when the other side wall $E_2$ becomes the configuration of the half circle (portion d of FIG. 10).

As set forth above, without joining the opposing longer side walls, the rectangular TE10 mode can be converted into the circular TE01 mode.

FIGS. 12(a) to 12(e) show sections of various portions a to e of FIG. 10 in a conversion of the rectangular TE20 mode into the circular TE02 mode.

Figure 13:
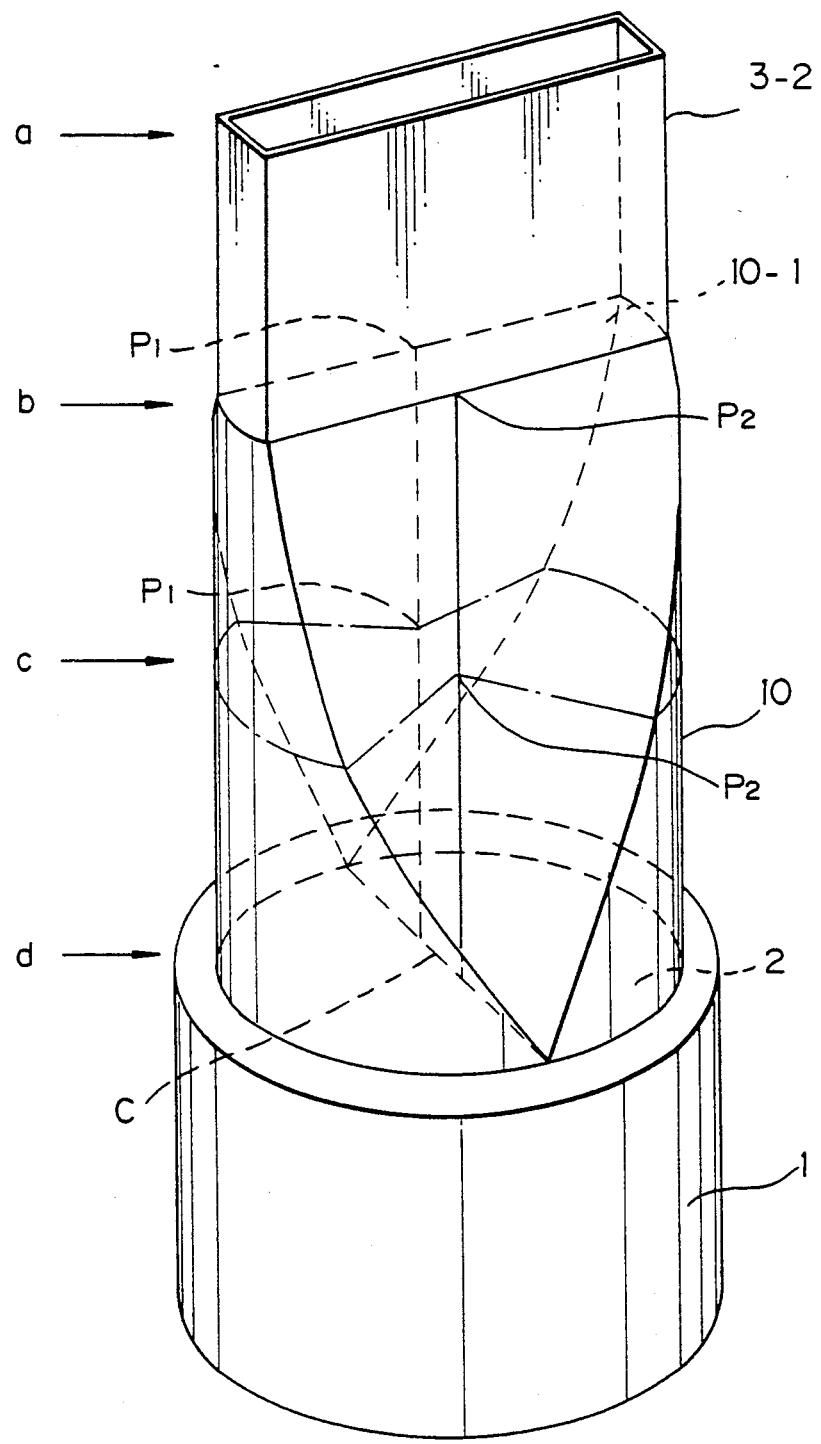
FIG. 13 is a perspective view of a still further embodiment of the present invention for converting the TE20 rectangular induction waveguide into the TE01 circular waveguide.
Figure 14A:
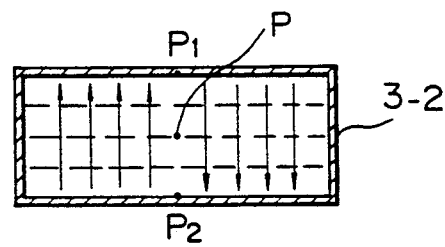
FIGS 14(a) to 14(d) are sections of respective portions a to e of FIG. 13.
Figure 14B:
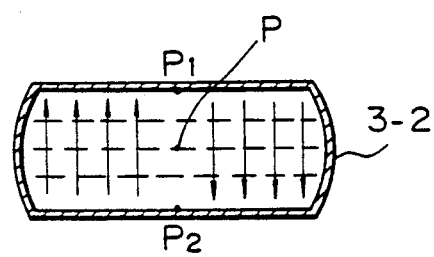
Figure 14C:
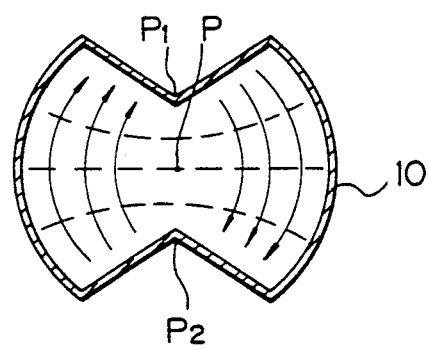
Figure 14D:
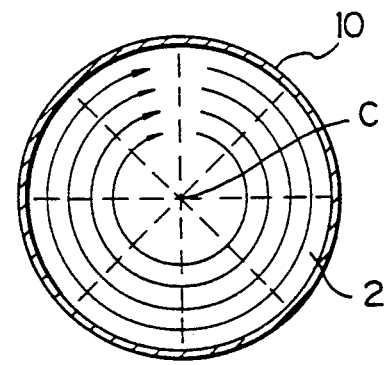
Figure 15:
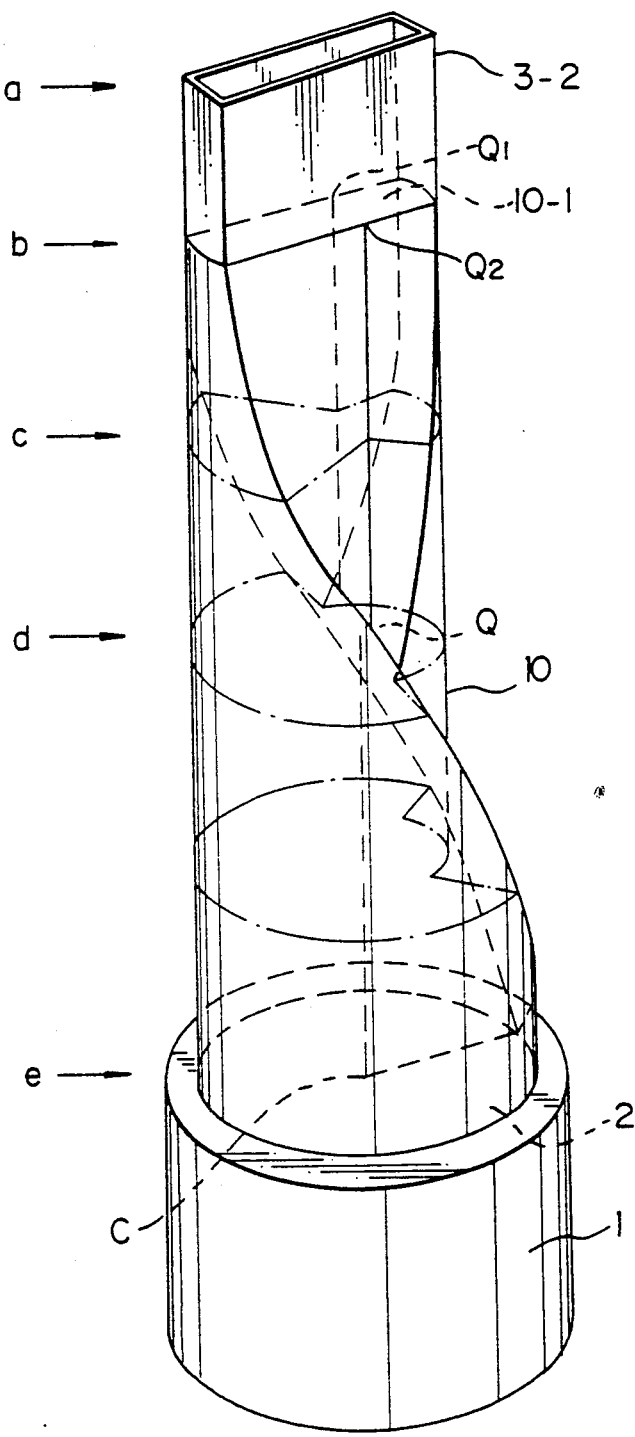
FIG. 15 is a perspective view of a still further embodiment of the present invention for converting the TE30 rectangular induction tube into the TE02 circular induction tube.
Figure 16A:
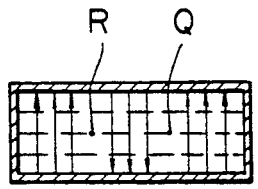
FIGS. 16(a) to 16(e) are sections of respective portions a to e of FIG. 15.
Figure 16B:
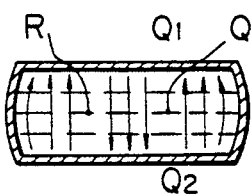
Figure 16C:
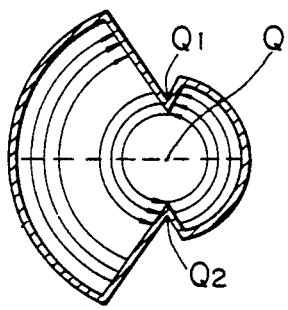
Figure 16D:
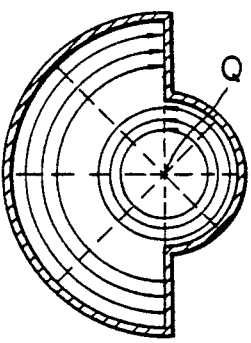
Figure 16E:
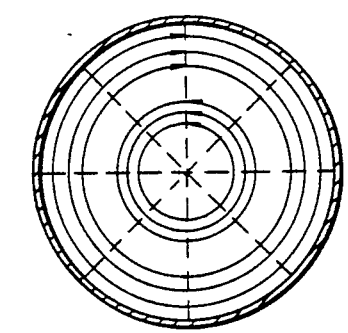
Figure 19A:
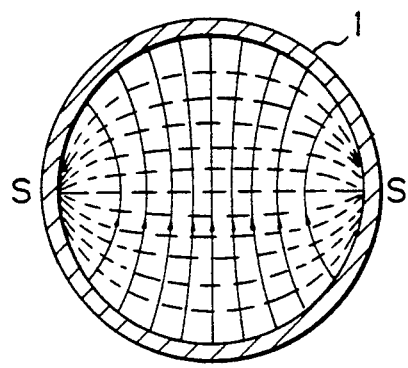
FIGS. 19(a) and 19(b) are illustrations showing an electromagnetic field distribution when the rectangular waveguide of TE10 is converted into a circular configuration.
Figure 19B:
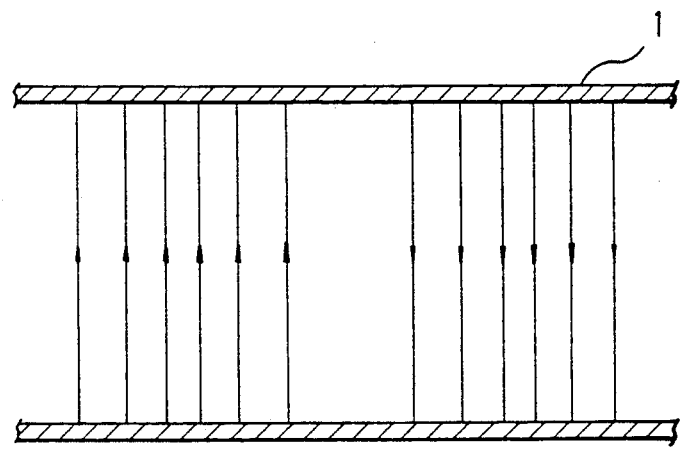
Figure 20:
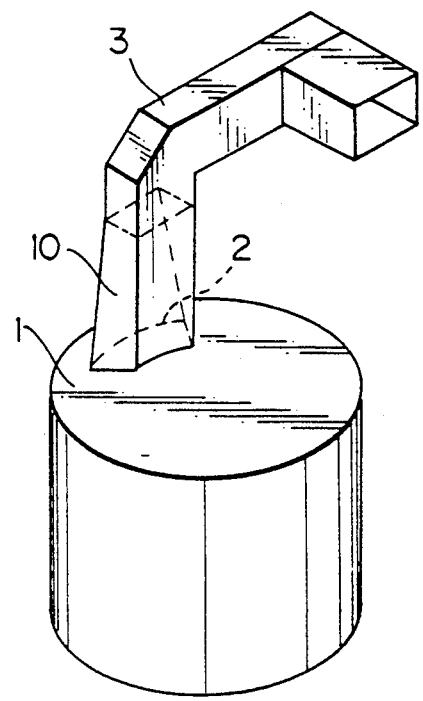
FIG. 20 is an illustration showing one example of the prior art associated with generation of large area plasma.
Figure 21A:
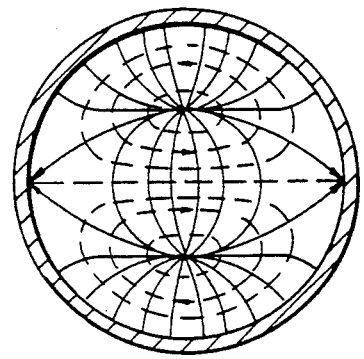
FIGS. 21(a) and 21(b) are illustrations showing the electromagnetic field distribution in TM11 mode.
Figure 21B:
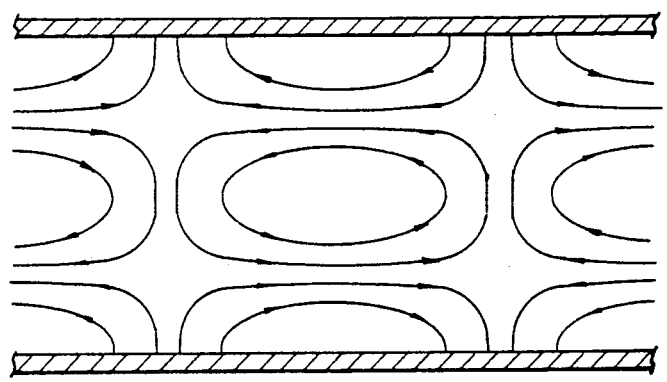
Figure 22A:
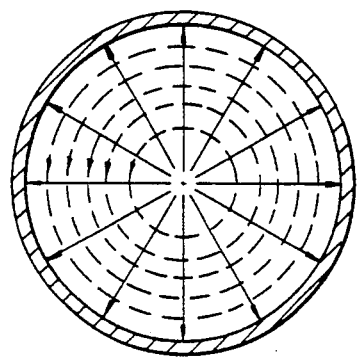
FIGS. 22(a) and 22(b) are illustrations showing the electromagnetic field distributions in TM01 mode.
Figure 22B:
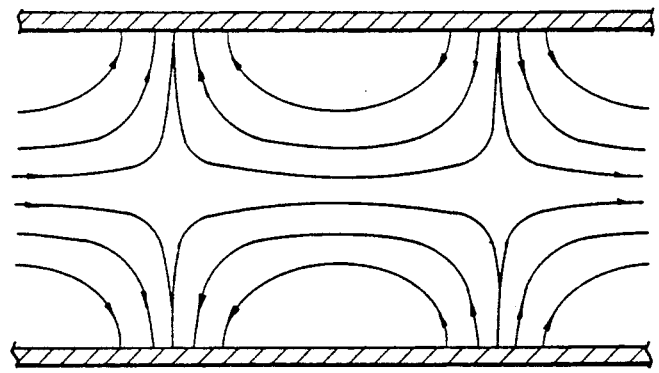

On the other hand, even in case of the embodiments of FIGS. 4 and 7, without joining the longer side walls at points $P_1$ and $P_2$ or at points $Q_1$ and $Q_2$, conversion from the rectangular TE20 mode to the circular TE01 mode, or from the rectangular TE30 mode to the circular TE02 mode, i.e. circular TE0n mode, can be performed as shown in FIGS. 13 and 15.

In the shown embodiments of the present invention constructed as set forth above, in the TE01 mode, since the relationship $\lambda c = 1.640a$ is established between the cut-off wavelength $\lambda c$ of the microwave and the radius a of the cylindrical waveguide, the size of the microwave waveguide can be 2.08 times that of the conventional TE11 mode. Also, in TE02 mode, since the relationship $\lambda c = 0.896$ can be established, and in the TE03 mode, the relationship $\lambda c = 0.618$ can be established, the size of the microwave waveguide can be respectively 3.81 times and 5.52 times that of the conventional TE11 mode.

We claim:

1. A microwave plasma processing apparatus including a microwave waveguide connected to a microwave power source, a mode converting wave guide and a plasma chamber, comprising:
   a lower induction waveguide forming part of said microwave waveguide and connected to said mode converting waveguide including:
   a rectangular form inlet portion; and
   a cylindrical portion having one of shorter side walls including a point corresponding to a center point of a connecting portion connected to said plasma chamber, and the other of said shorter side walls formed into arc shaped configuration corresponding to a circle of said connecting portion connected to said plasma chamber, said arc shaped shorter side wall being gradually expanded about said center point, to form a window portion of said mode converting waveguide; and
   said mode converting waveguide extending between said window portion thereof to said connecting portion connected to said plasma chamber, being formed by gradually extending said arc forming said window portion toward said connecting portion and joining opposing longer side walls to each other to establish said connecting portion connected to said plasma chamber at the end thereof where said both longer side walls meet.

2. An apparatus as set forth in claim 1, wherein the length of said one of the shorter side walls is gradually reduced to converge at a point corresponding to the center point of said connecting portion with said plasma chamber.

3. An apparatus as set forth in claim 1, wherein a propagation mode in said microwave waveguide is a rectangular TE10 mode and a propagation mode in said plasma chamber is a TE01 mode.

4. An apparatus as set forth in claim 1, wherein said mode converting waveguide varies the configuration continuously.

5. An apparatus as set forth in claim 1, wherein said mode converting wave guide varies the configuration stepwise.

6. An apparatus as set forth in claim 1, wherein a propagation mode in said microwave guide is a rectangular TE20 mode and a propagation mode in said plasma generation chamber is a TE02 mode.

7. A microwave plasma processing apparatus including a microwave waveguide connected to a microwave power source, a mode converting waveguide and a plasma chamber, comprising:
   a lower microwave induction tube forming part of said microwave guide and connected to said mode converting wave guide including:
   a rectangular form inlet portion; and a cylindrical portion having opposing shorter side walls formed into an arc shaped configuration about the center point of said connecting portion connected to said plasma chamber, to form a window portion of said mode converting waveguide; and
   said mode converting wave guide extending between said window portion thereof to said connecting portion connected to said plasma chamber, being formed by gradually extending said arc shaped configuration and joining opposing longer side walls to each other to establish said connecting portion connected to said plasma chamber at the end thereof where said both longer side walls meet.

8. An apparatus as set forth in claim 7, wherein opposing longer side walls are gradually bent about points P1 and P2 and said points P1 and P2 are converged at a point corresponding to the center point of said connecting portion with said plasma chamber for forming said window portion.

9. An apparatus as set forth in claim 7, wherein a propagation mode in said microwave waveguide a rectangular TE20 mode and a propagation mode in said plasma chamber is a TE01 mode.

10. An apparatus as set forth in claim 7, wherein said mode converting waveguide varies the configuration continuously.

11. An apparatus as set forth in claim 7, wherein said mode converting waveguide varies the configuration stepwise.

12. A microwave plasma processing apparatus including a microwave waveguide connected to a microwave power source, a mode converting waveguide and a plasma generation chamber, comprising:
   a lower induction waveguide forming part of said microwave waveguide and connected to said mode converting waveguide including: a rectangular form inlet portion; and a cylindrical portion having shorter side walls formed into two arc shaped configurations about a center point taken at one of points Q and R where no electric field is present at said rectangular inlet portion and corresponding to a center point of said connecting portion connected to said plasma chamber to form a window portion of said mode converting waveguide; and
   said mode converting waveguide extending between said window portion thereof to said connecting portion connected to said plasma chamber, being formed by gradually extending said two larger and smaller arc shaped configuration to form larger and smaller half circles, by further increasing a center angle of said larger half circle, joining opposing longer side walls to establish a part of diameter of said large half circle, and joining said longer side walls forming said part of diameter to establish said connecting portion connected to said plasma chamber at the end thereof where said both longer side walls meet.

13. An apparatus as set forth in claim 12, wherein said mode converting waveguide varies the configuration continuously.

14. An apparatus as set forth in claim 12, wherein said mode converting waveguide varies the configuration stepwise.

15. An apparatus as set forth in claim 12, wherein said opposing points on said longer side walls are converged at said center point by bending said longer side walls to form said window portion of said mode converting waveguide.

16. An apparatus as set forth in claim 12, wherein a propagation mode in said microwave waveguide is a TE30 mode and a propagation mode in said plasma generation chamber is a TE02 mode.

17. An apparatus as set forth in claim 12, wherein said opposing points on said longer side walls are converged at said center point by bending said longer side walls for forming said window portion of said mode converting waveguide, and a propagation mode in said microwave waveguide is a TE30 mode and a propagation mode in said plasma chamber is a TE02 mode.

* * * * *